United States Patent
Chyan et al.

(10) Patent No.: US 6,358,807 B1
(45) Date of Patent: Mar. 19, 2002

(54) BIPOLAR SEMICONDUCTOR DEVICE AND METHOD OF FORMING SAME HAVING REDUCED TRANSIENT ENHANCED DIFFUSION

(75) Inventors: Yih-Feng Chyan; Chung Leung, both of Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/504,306

(22) Filed: Feb. 15, 2000

(51) Int. Cl.$^7$ .............................................. H01L 21/331
(52) U.S. Cl. ........................ 438/309; 438/202; 438/511
(58) Field of Search ................................. 438/202, 234, 438/203, 204, 205, 369, 378, 511, 516, 514

(56) References Cited

U.S. PATENT DOCUMENTS

| | | | |
|---|---|---|---|
| 4,559,696 A | * | 12/1985 | Anand et al. |
| 5,158,897 A | * | 10/1992 | Sato et al. |
| 5,489,550 A | | 2/1996 | Moslehi |
| 5,599,735 A | | 2/1997 | Moslehi |
| 5,670,391 A | | 9/1997 | Lim et al. |
| 5,731,626 A | | 3/1998 | Eaglesham et al. ......... 257/607 |
| 5,972,760 A | | 10/1999 | Ju ............................... 438/305 |
| 6,013,332 A | | 1/2000 | Goto et al. ................. 427/530 |

* cited by examiner

Primary Examiner—Tuan H. Nguyen
(74) Attorney, Agent, or Firm—Allen, Dyer, Doppelt, Milbrath & Gilchrist, P.A.

(57) ABSTRACT

A BiCMOS semiconductor device and a method of forming same are disclosed. A bipolar transistor region is formed adjacent a CMOS device region within a semiconductor substrate. Carbon is implanted in an amount ranging from about $10^{13}$ to about $10^{14}$ cm$^{-2}$ before forming the base, emitter and collector within the bipolar transistor region to aid in suppressing transient enhanced diffusion. The bipolar transistor region is subject to rapid thermal annealing to aid in suppressing the transient enhanced diffusion.

12 Claims, 5 Drawing Sheets

BIPOLAR SEMICONDUCTOR DEVICE AND METHOD OF FORMING SAME HAVING REDUCED TRANSIENT ENHANCED DIFFUSION

FIELD OF THE INVENTION

This invention relates to the field of semiconductor devices, and more particularly, this invention relates to reducing transient enhanced diffusion in a semiconductor device.

BACKGROUND OF THE INVENTION

The manufacture of BiCMOS and similar semiconductor devices that use bipolar transistors often suffer from Transient Enhanced Diffusion (TED) after the implant anneal and the related source/drain anneal. One result of Transient Enhanced Diffusion is a changed device profile and a slower device speed. It is well known that some dopant diffusion in semiconductor manufacturing can be controlled through Rapid Thermal Annealing (RTA) to enable electrical activation. However, even with Rapid Thermal Annealing processes, Transient Enhanced Diffusion still occurs during post-implant annealing.

Transient Enhanced Diffusion arises from the diffusion of dopant atoms, particular boron (B) and phosphorous (P), which also creates silicon self-interstitials that are generated by the implantation process. The implantation process damages the crystal lattice structure of a target, creating these interstitials, where the atoms occupy interstices between normal lattice sites. Rapid Thermal Annealing is known to reduce the effects of this abnormality. However, even with the Rapid Thermal Annealing, the Transient Enhanced Diffusion still increases the diffusion rate by a factor of 10 to 1,000, as caused by the excess insterstitials.

Transient Enhanced Diffusion is also a problem in MOS devices, where lateral diffusion of the drain and source implants adversely affects threshold adjust implant at a gate region. Additionally, the BiCMOS devices that use CMOS structures and associated bipolar transistors suffer from Transient Enhanced Diffusion because the bipolar structure is particularly subject to TED during the device processing and implantation stages.

SUMMARY OF THE INVENTION

It is therefore an object of the present invention to provide a semiconductor device and method of forming same that aids in suppressing Transient Enhanced Diffusion, especially with BiCMOS devices.

In accordance with the present invention, a method of forming a semiconductor device comprises the step of forming a bipolar transistor region adjacent a CMOS device region within a semiconductor substrate. Carbon is implanted in an amount of about $10^{13}$ to about $10^{14}$ cm$^{-2}$ within the bipolar transistor region of the semiconductor substrate before forming the base, emitter and collector within the bipolar transistor region. The carbon implantation of the present invention in this amount aids in suppressing Transient Enhanced Diffusion for the bipolar structure.

The bipolar transistor region is then rapid thermal annealed at a temperature ranging from about 900° C. to about 1250° C., and preferably about 1050° C. This rapid thermal annealing occurs for a time period ranging from about 5 seconds to about 100 seconds, and preferably for about 10 seconds.

In still another aspect of the present invention, the method comprises the step of forming the CMOS device region as a PMOS and an NMOS and forming within the bipolar transistor region an NPN transistor, which is adjacent the NMOS. The method can also comprise the steps of forming lightly doped drain structures in the NMOS followed by forming lightly doped drain structures in the PMOS. The source and drain regions of the NMOS can be implanted first followed by implanting source and drain regions of the PMOS. A deep buried layer can be implanted within the bipolar transistor region and a pedestal and base of the bipolar transistor can then be formed by implantation.

In still another aspect of the present invention, a BiCMOS semiconductor device includes a semiconductor substrate having a CMOS and a bipolar transistor positioned adjacent the CMOS. The bipolar transistor includes a base, emitter and collector. Implanted carbon ranging in an amount from about $10^{13}$ to about $10^{14}$ cm$^{-2}$ has been implanted before the emitter and collector have been formed to aid in suppressing transient enhanced diffusion once the bipolar transistor is formed. The CMOS device region can be formed as a PMOS and an NMOS. The bipolar transistor is formed adjacent the NMOS and formed as an NPN transistor.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention is advantageous because it now provides a bipolar transistor, and more particularly, a BiCMOS semiconductor device having a CMOS and associated bipolar transistor that has a reduced Transient Enhanced Diffusion (TED), and more particularly, reduced boron TED. The present invention is also advantageous for use in other, similar bipolar transistor applications where Transient Enhanced Diffusion is a problem.

FIGS. 1–16 illustrate fragmentary sectional diagrams showing a possible sequence of manufacturing steps to form a semiconductor device of the present invention. Although a BiCMOS semiconductor device is described in detail, any bipolar transistor can incorporate the claimed advantages of the present invention, where the sufficiently implanted carbon aids in reducing Transient Enhanced Diffusion. The fragmentary sectional diagrams do not show all possible manufacturing steps, but the diagrams do show the basic sequences. For purposes of clarity, not all layers used in the manufacture of the illustrated BiCMOS are illustrated. The sectional drawings illustrate the basic sequences in the manufacturing of the semiconductor device as would be understood by those skilled in the art. One skilled in the art would also understand the basic sequences based upon the drawings and description as set forth below and used within other similar semiconductor devices.

Figure 1:
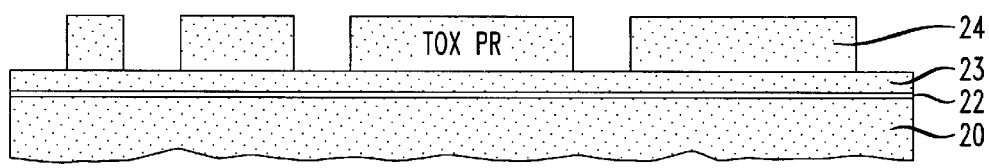
FIG. 1 is a fragmentary sectional diagram showing the first stage in the sequence of manufacturing a BiCMOS semiconductor device of the present invention, after the pad oxide has been applied, nitride deposited and photoresist applied.

FIG. 1 illustrates a first step in the manufacturing sequence where a semiconductor substrate 20 is provided. An etch stop nitride layer 22 is deposited together with a pad oxide 23. A TOx photoresist 24 is applied for the deep ultraviolet oxide photoresist, as known to those skilled in the art.

Figure 2:
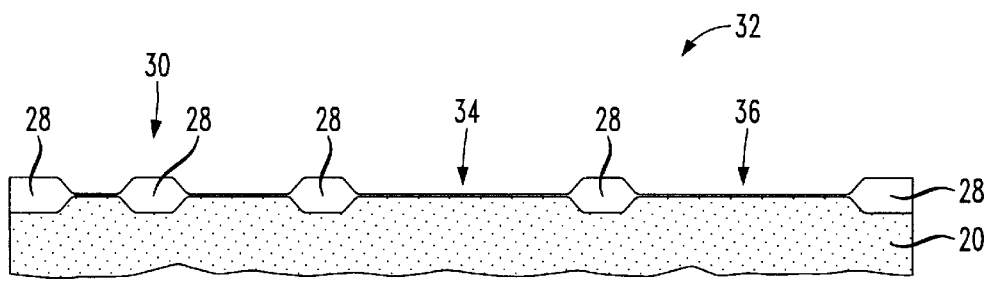
FIG. 2 is a fragmentary sectional diagram of the next manufacturing sequence showing the removal of the photoresist and a nitride etching and stripping of the pad oxide.
Figure 3:
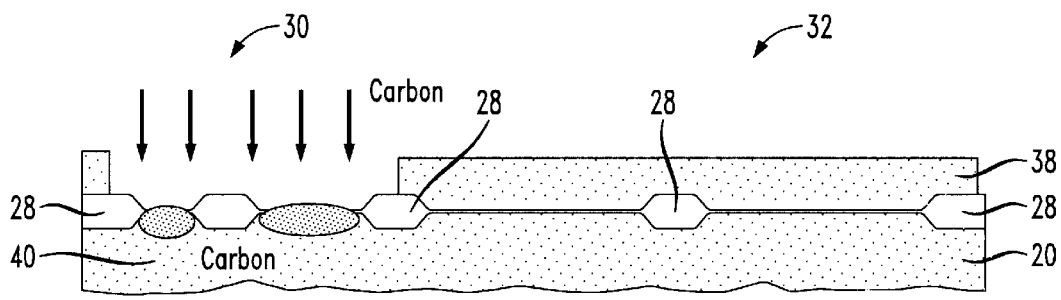
FIG. 3 is a fragmentary sectional diagram showing the next manufacturing sequence where carbon is implanted into the bipolar transistor region.

The next sequence of FIG. 2 is obtained through a nitride etching and then stripping the photoresist. A field oxide is formed and an oxide/nitride robot etch performed. The pad oxide is stripped and screen oxide formed to obtain the spacers 28 that define the bipolar transistor region 30 and the CMOS device region 32, having what will be an NMOS 34 region and PMOS region 36.

The CMOS device region 32 is covered with a bipolar photoresist 38. Only the bipolar transistor region 30 is left open for the implantation process as illustrated. In accordance with the present invention, a sufficient, but not maximum amount of carbon, has been found to be advantageous at this stage of the manufacturing process to reduce TED. Carbon 40 is implanted in an amount ranging from about $10^{13}$ to about $10^{14}$ cm$^{-2}$ within the bipolar transistor region 30 of the semiconductor substrate 20, and in some instances, more particularly at what will be the base, in techniques known to those skilled in the art. This region is then subject to Rapid Thermal Annealing (RTA) in a temperature range of about 900° C. to about 1250° C., and in one aspect of the present invention, about 1050° C. The Rapid Thermal Annealing occurs for a time period of about 5 seconds to about 100 seconds, and in one aspect of the present invention, for a period of about 10 seconds.

Figure 4:
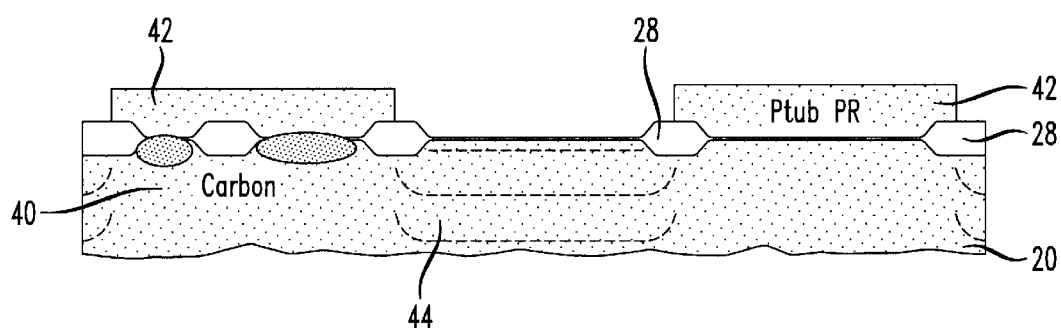
FIG. 4 is a fragmentary sectional diagram of the next manufacturing sequence showing the applied Ptub photoresist and Ptub implantation.
Figure 5:
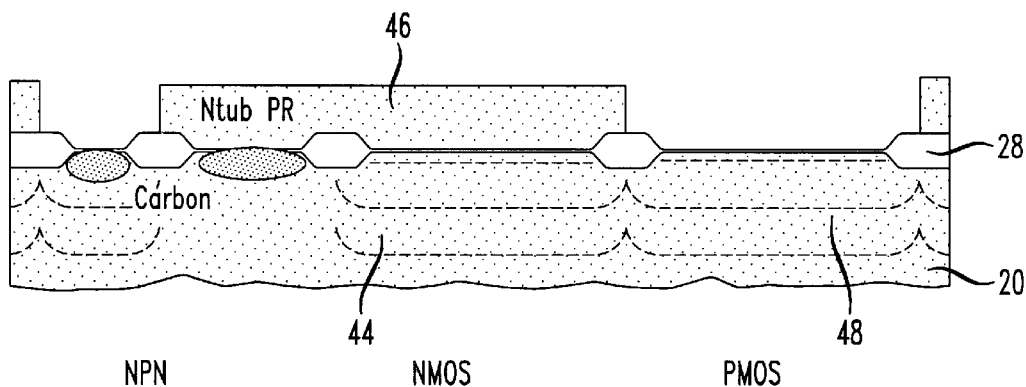
FIG. 5 is a fragmentary sectional diagram showing the next manufacturing sequence with the applied Ntub photoresist and Ntub implantation.

A Ptub photoresist 42 is deposited over the PMOS region 36 and the Ptub 44 implanted (FIG. 4). This photoresist 42 is stripped and an Ntub photoresist 46 applied and the Ntub implanted 48 (FIG. 5).

Figure 6:
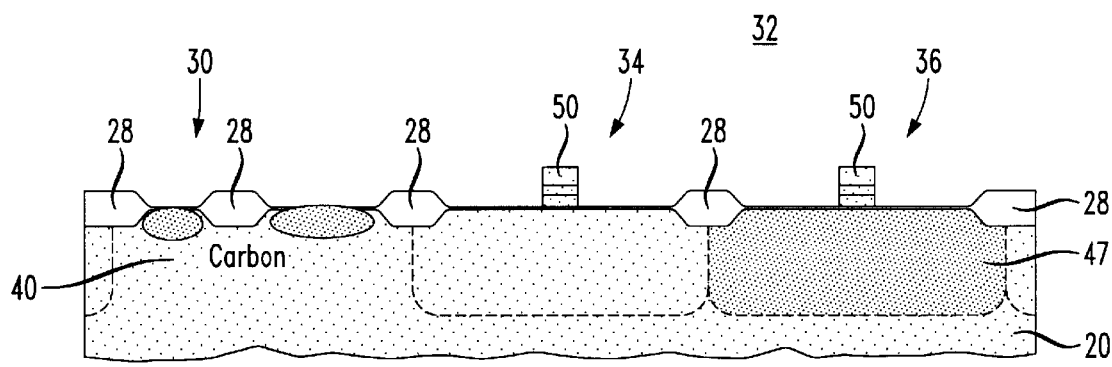
FIG. 6 is a fragmentary sectional diagram showing the next manufacturing sequence having a polycide gate etch and known steps that form the structure as illustrated.

The photoresist 46 is stripped and any screen oxide is stripped. A gate oxide is applied and followed with a polysilicon deposition. As is known to those skilled n the art, a hard tungsten silicon (WSi) layer can be applied. Phosphorous 47 is implanted and a hard mask deposited (HM). A deep ultraviolet gate photoresist (DUV) is applied followed by a hard mask etch. The photoresist is stripped and the polycide gate is etched to obtain the structure as shown in FIG. 6, having the centrally formed layers 50 within the NMOS 34 and PMOS 36 regions.

Figure 7:
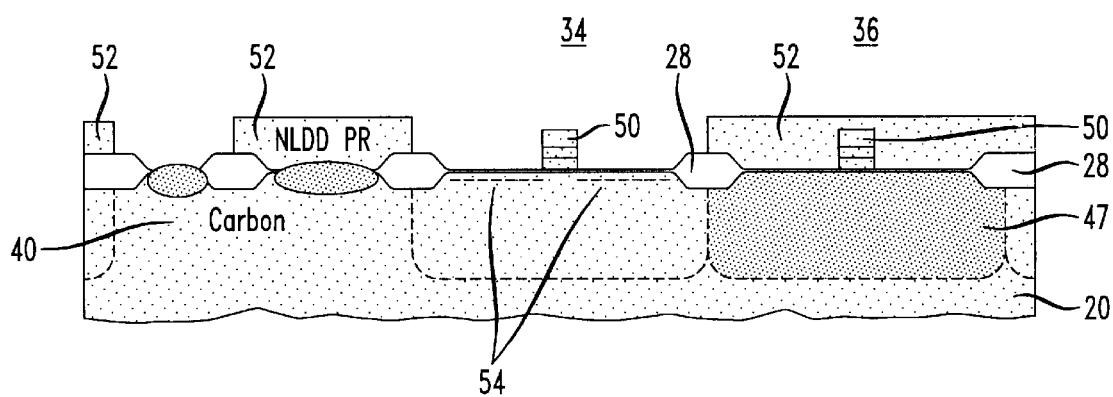
FIGS. 7 and 8 are fragmentary sectional diagrams that show the forming of lightly doped drain structures within the NMOS and PMOS.
Figure 8:
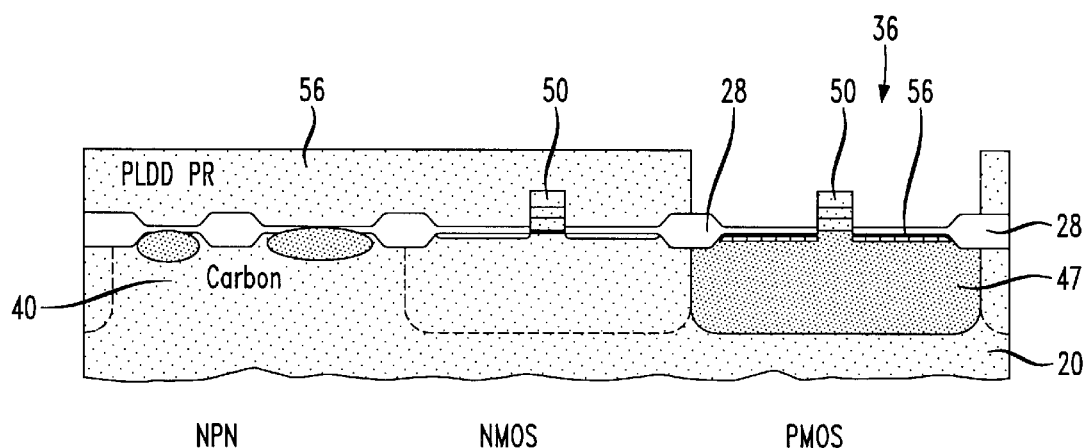

Referring now to FIGS. 7 and 8, lightly doped drain structures are formed in the NMOS and CMOS regions 36, 38. As shown in FIG. 7, an N lightly doped drain structure photoresist 52 is applied over the PMOS region 36 and other regions to allow the N lightly doped drain structure 54 to be implanted at the NMOS region 34. FIG. 8 illustrates that the photoresist 52 is stripped and a P lightly doped drain structure photoresist 56 applied over the bipolar transistor region 30 and the NMOS region 34. The P lightly doped drain structure 56 is implanted and then the photoresist stripped.

Figure 9:
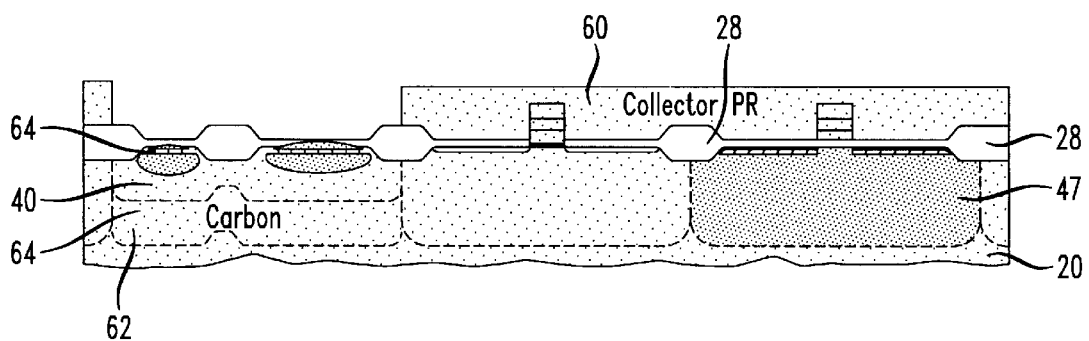
FIG. 9 is a fragmentary sectional diagram showing the next manufacturing sequence where the collector photoresist is applied, the deep buried layer (BL) formed, and the pedestal and base are implanted.
Figure 10:
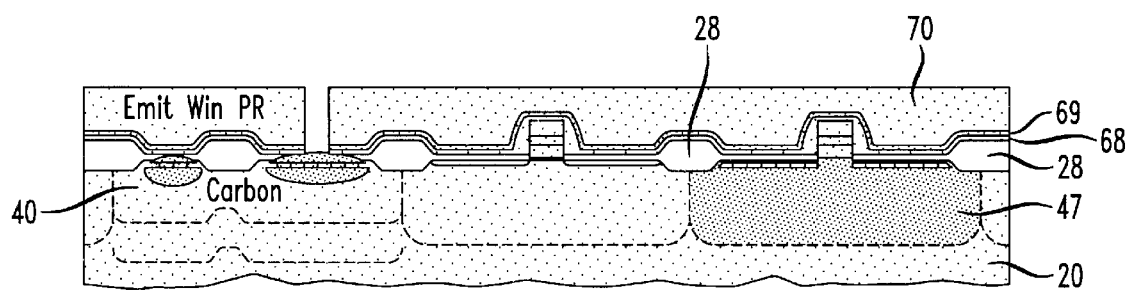
FIG. 10 is a fragmentary sectional diagram showing the next manufacturing sequence after applying a TEOS spacer, silicon and emitter window photoresist deposition, and an etch-stop on the TEOS.
Figure 11:
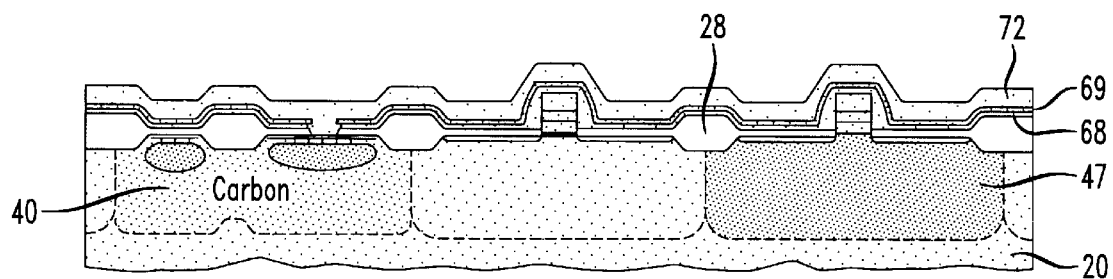
FIG. 11 is a fragmentary sectional diagram showing the next manufacturing sequence with the emitter polysilicon deposition and implanting.

As shown in FIG. 9, the collector of the bipolar is formed by first applying a collector photoresist 60 and then implanting a deep buried layer (BL) 62 followed by implanting a pedestal 64 and implanting the base 69. The photoresist is then stripped 60. Referring now to FIG. 10, a TEOS spacer deposit 68 of about 1200 angstroms is applied and a 600 angstrom A-Si silicon 69 deposited. An emitter window photoresist 70 is applied. A window poly etch step occurs on the TEOS. The photoresist 70 is stripped and a wet oxide etching performed followed by an emitter poly deposition 72 and an emitter poly implant to form the structure as shown in FIG. 11.

Figure 12:
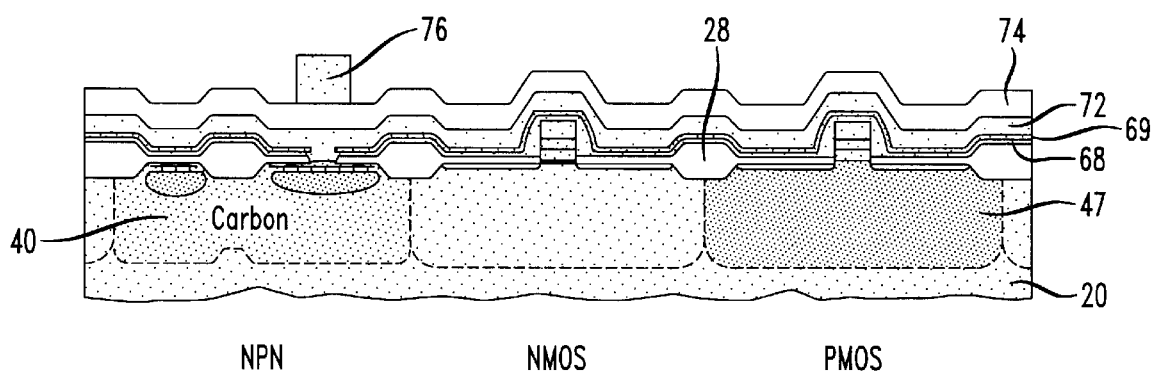
FIG. 12 is a fragmentary sectional diagram showing the next manufacturing sequence with a PETEOS deposition and the emitter polysilicon photoresist application.
Figure 13:
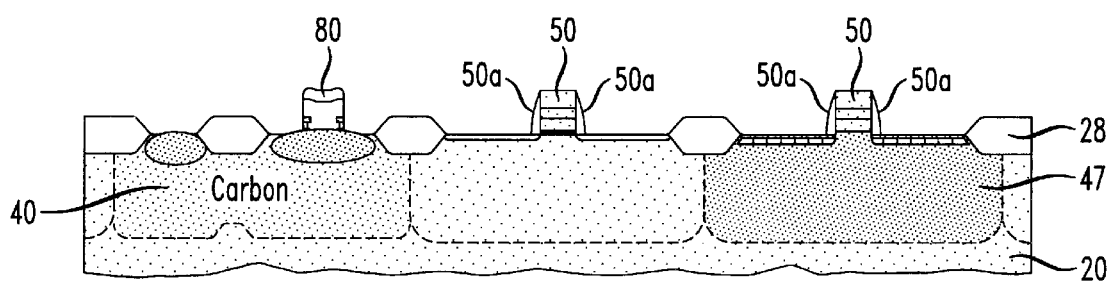
FIG. 13 is a fragmentary sectional diagram showing the next manufacturing sequence with the PETEOS etching and emitter polysilicon and spacer etching.

A plasma enhanced tetraethyl orthosilicate layer (PETEOS) 74 is deposited followed by an emitter poly photoresist 76 application (FIG. 12). The hard mask PETEOS etch occurs and any photoresist stripped followed by an emitter poly etching and spacer etching to obtain the structure as shown in FIG. 13, where central layers 50 have side spacers 50a layered bipolar structure 80.

Figure 14:
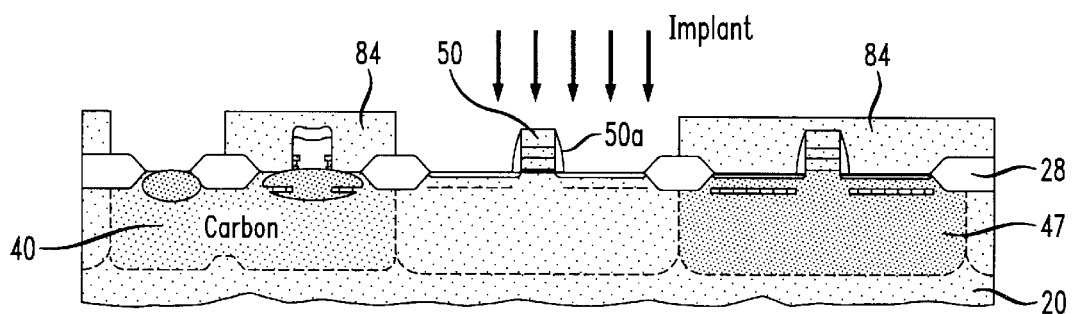
FIGS. 14 and 15 are fragmentary sectional diagrams showing the next manufacturing sequences with the N+ source and drain implanting and the P+ source and drain implanting.
Figure 15:
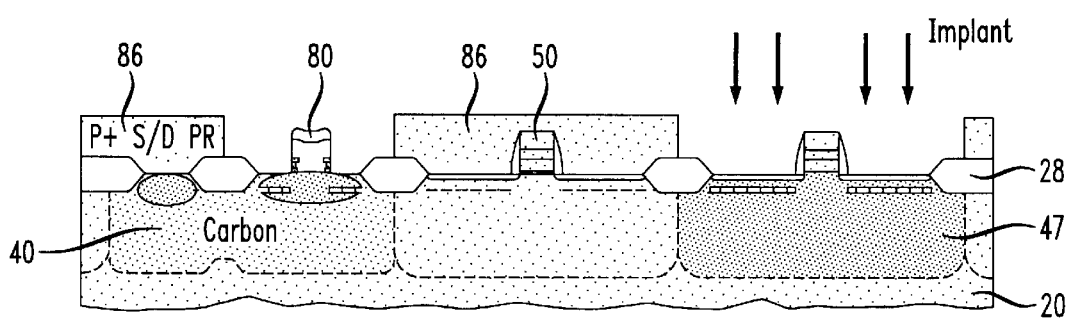
Figure 16:
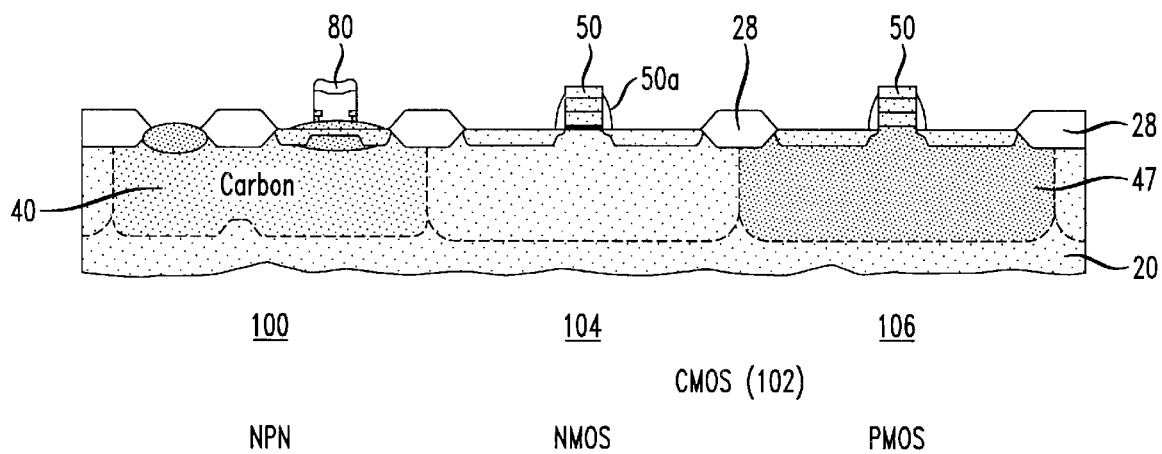
FIG. 16 is a fragmentary sectional diagram showing a final product prior to deposition and metallization.

FIG. 14 illustrates a fragmentary sectional drawing as in the previous FIGS. 1–13, where the N+ source/drain photoresist 84 is deposited over PMOS region 36 and portion of NPN 30. The open areas corresponding to NMOS 34 is implanted followed by the source/drain Rapid Thermal Annealing. The photoresist 34 is stripped and the P+ source/drain photoresist 86 applied over the NMOS 34 with the source/drain implanting of the P+ region to form the PMOS (FIG. 15). After stripping, the final appearance of a BiCMOS prior to D1 deposition and metallization is shown in FIG. 16 showing the NPN transistor 100, and the CMOS transistor device 102 with the NMOS 104 and PMOS 106 acting as complementary MOS devices.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A method of forming a semiconductor device comprising the steps of;
   forming a bipolar transistor region adjacent a CMOS device region within a semiconductor substrate;
   implanting carbon in an amount ranging from about $10^{13}$ to about $10^{14}$ cm$^{-2}$ only within the bipolar transistor region of the semiconductor substrate;
   before forming the base, emitter and collector to aid in suppressing transient enhanced diffusion; and
   rapid thermal annealing the bipolar transistor region at a temperature ranging from about 900° C. to about 1250° C. for a time period ranging from about 5 seconds to about 100 seconds.

2. A method according to claim 1, and further comprising the step of rapid thermal annealing the bipolar transistor region at about 1050° C.

3. A method according to claim 1, and further comprising the step of rapid thermal annealing for about 10 seconds.

4. A method according to claim 1, and further comprising the step of forming the CMOS device region as a PMOS and an NMOS.

5. A method according to claim 4, and further comprising the step of forming lightly doped drain structures in the NMOS followed by forming lightly doped drain structures in the PMOS.

6. A method according to claim 4, and further comprising the step of implanting source and drain regions of the NMOS followed by implanting source and drain regions of the PMOS.

7. A method according to claim 4, and further comprising the step of forming the bipolar transistor as an NPN transistor adjacent the NMOS.

8. A method according to claim 1, and further comprising the step of implanting a deep buried layer within the bipolar transistor region, and implanting a pedestal and implanting dopants to form the base of the bipolar transistor.

9. A method for forming a BiCMOS semiconductor device comprising the steps of:
   implanting carbon in an amount ranging from about $10^{13}$ to about $10^{14}$ cm$^{-2}$ only within a bipolar transistor region of a semiconductor substrate that is formed in a semiconductor substrate and adjacent a CMOS device region having an NMOS and PMOS region formed in the semiconductor substrate;
   rapid thermal annealing the bipolar transistor region at a temperature ranging from about 900 to about 1250° C. for about 5 to about 20 seconds;
   implanting Ptub and Ntub regions within the respective NMOS and PMOS regions;
   forming lightly doped drain structures within the respective NMOS and PMOS region;
   implanting the bipolar transistor region with predetermined dopants to form the base, emitter and collector of the bipolar transistor; and
   implanting respective sources and drains of the respective NMOS and PMOS regions to form a BiCMOS device having a suppressed transient enhanced diffusion.

10. A method of forming a bipolar transistor comprising the steps of:
    implanting carbon in an amount ranging from about $10^{13}$ to about $10^{14}$ cm$^{-2}$ only within a bipolar transistor region of a semiconductor substrate before forming the emitter and collector of the bipolar transistor within the bipolar transistor region; and
    rapid thermal annealing the bipolar transistor region at a temperature ranging from about 900° C. to about 1250° C. and for a time period ranging from about 5 seconds to about 100 seconds to aid in suppressing boron transient enhanced diffusion.

11. A method according to claim 10, and further comprising the step of annealing the bipolar transistor region at about 1050° C.

12. A method according to claim 10, and further comprising the step of rapid thermal annealing for about 10 seconds.

* * * * *